US012588484B2

(12) United States Patent
    Xie et al.

(10) Patent No.:  US 12,588,484 B2
(45) Date of Patent:      Mar. 24, 2026

(54) BACKSIDE DIFFUSION BREAK

(71) Applicant: INTERNATIONAL BUSINESS MACHINES CORPORATION, Armonk, NY (US)

(72) Inventors: Ruilong Xie, Niskayuna, NY (US); Jianwei Peng, Clifton Park, NY (US); Shay Reboh, Guilderland, NY (US); Brent A. Anderson, Jericho, VT (US); Nicholas Alexander Polomoff, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 389 days.

(21) Appl. No.: 18/507,181

(22) Filed: Nov. 13, 2023

(65) Prior Publication Data

US 2025/0157886 A1      May 15, 2025

(51) Int. Cl.
    *H10W 20/20*      (2026.01)
    *H10D 30/01*      (2025.01)
    *H10D 30/43*      (2025.01)
    *H10D 30/67*      (2025.01)
    *H10D 62/10*      (2025.01)
                (Continued)

(52) U.S. Cl.
    CPC .......... *H10W 20/20* (2026.01); *H10D 30/014* (2025.01); *H10D 30/43* (2025.01); *H10D 30/6729* (2025.01); *H10D 30/6735* (2025.01); *H10D 30/6757* (2025.01); *H10D 62/121* (2025.01); *H10D 62/151* (2025.01);
                (Continued)

(58) Field of Classification Search
    None
    See application file for complete search history.

(56) References Cited

U.S. PATENT DOCUMENTS 11,621,197 B2      4/2023   Su
11,699,742 B2      7/2023   Chung
                (Continued)

FOREIGN PATENT DOCUMENTS

KR        20230034172 A        3/2023

OTHER PUBLICATIONS

Kwon, et al., "TCAD challenges and opportunities to find a feasible device architecture for sub-3nm scaling." Published Sep. 2021. 6 pages. In 2021 International Conference on Simulation of Semiconductor Processes and Devices (SISPAD) (pp. 5-10). IEEE. http://in4.iue.tuwien.ac.at/pdfs/sispad2021/S1.1.pdf. See abstract.

*Primary Examiner* — Bitew A Dinke
(74) *Attorney, Agent, or Firm* — Scott Dobson

(57)            ABSTRACT

A semiconductor component includes a backside contact. The semiconductor component further includes two inactive transistor gates each associated with a region of source/drain material of a respective transistor. The region of source/drain material of at least one of the transistors is in direct contact with the backside contact. The semiconductor component further includes a diffusion break formed between the two inactive transistor gates and made of a dielectric material. The diffusion break extends from a lowermost surface that is substantially coplanar with a lowermost surface of the backside contact to an uppermost surface that is substantially coplanar with an uppermost surface of the region of source/drain material of at least one of the inactive transistor gates.

25 Claims, 17 Drawing Sheets

<u>300</u>

(51) Int. Cl.
  *H10D 62/13* (2025.01)
  *H10D 84/01* (2025.01)
  *H10D 84/03* (2025.01)
  *H10D 84/83* (2025.01)

(52) U.S. Cl.
  CPC ....... *H10D 84/013* (2025.01); *H10D 84/0149* (2025.01); *H10D 84/038* (2025.01); *H10D 84/83* (2025.01)

(56) References Cited

U.S. PATENT DOCUMENTS

| | | | | |
|---|---|---|---|---|
| 2021/0111115 | A1 | 4/2021 | Morrow | |
| 2021/0134721 | A1 | 5/2021 | Chiang | |
| 2021/0202385 | A1 | 7/2021 | Huang | |
| 2021/0305252 | A1 | 9/2021 | Chiang | |
| 2021/0305381 | A1 | 9/2021 | Chiang | |
| 2021/0351303 | A1 | 11/2021 | Ju | |
| 2021/0376071 | A1 | 12/2021 | Liu | |
| 2021/0376093 | A1 | 12/2021 | Chu | |
| 2022/0037496 | A1 | 2/2022 | Chen | |
| 2022/0165848 | A1* | 5/2022 | Lin | H10D 64/017 |
| 2022/0262915 | A1* | 8/2022 | Su | H10D 30/031 |
| 2022/0328477 | A1 | 10/2022 | Chen | |
| 2023/0207553 | A1* | 6/2023 | Xie | H10D 84/0149 |
| 2023/0299081 | A1* | 9/2023 | Guler | H10D 30/014 |
| | | | | 257/347 |
| 2024/0096940 | A1* | 3/2024 | Li | H10D 30/6757 |
| 2024/0105613 | A1* | 3/2024 | Xie | H01L 21/76897 |
| 2024/0204064 | A1* | 6/2024 | Bouche | H10D 84/0167 |
| 2024/0282708 | A1* | 8/2024 | Yoo | H10D 64/017 |
| 2024/0321737 | A1* | 9/2024 | Guler | H10D 64/017 |
| 2024/0321747 | A1* | 9/2024 | Xie | H10D 30/6757 |
| 2024/0321978 | A1* | 9/2024 | Guler | H10D 62/121 |
| 2024/0387624 | A1* | 11/2024 | Kang | H10D 84/0188 |
| 2025/0275181 | A1* | 8/2025 | Zhou | H10D 30/43 |

* cited by examiner

300

308

300

320
370
368

BACKSIDE DIFFUSION BREAK

BACKGROUND

The present disclosure relates to the electrical, electronic, and computer fields. In particular, the present disclosure relates to the interconnects of semiconductor devices and methods of making the interconnects of semiconductor devices.

In particular, the present disclosure relates to forming semiconductor devices including diffusion breaks. Diffusion breaks are formed of dielectric material and are formed between two inactive transistor gates, thereby acting as a circuit break between active regions of the IC of the semiconductor component.

SUMMARY

Embodiments of the present disclosure include a semiconductor component. The semiconductor component includes a backside contact. The semiconductor component further includes two inactive transistor gates each associated with a region of source/drain material of a respective transistor. The region of source/drain material of at least one of the transistors is in direct contact with the backside contact. The semiconductor component further includes a diffusion break formed between the two inactive transistor gates and made of a dielectric material. The diffusion break extends from a lowermost surface that is substantially coplanar with a lowermost surface of the backside contact to an uppermost surface that is substantially coplanar with an uppermost surface of the region of source/drain material of at least one of the inactive transistor gates.

Additional embodiments of the present disclosure include a semiconductor component. The semiconductor component includes a plurality of transistor gates. Each transistor gate includes a region of source/drain material that is symmetrical about a vertical axis. The transistor gates are arranged such that the vertical axes of each region of source/drain material of adjacent transistor gates are separated by a gate spacing. The gate spacing is larger than a minimum spacing between all adjacent transistor gates. The semiconductor component further includes a diffusion break made of a region of dielectric material that is symmetrical about a vertical diffusion break axis. The diffusion break is arranged between two of the transistor gates such that a break spacing between the vertical diffusion break axis and the vertical axis of each of the two transistor gates is substantially equal to the gate spacing. The diffusion break has an uppermost surface that is substantially coplanar with an uppermost surface of the region of source/drain material of at least one of the two transistor gates. The diffusion break has a lowermost surface that is substantially coplanar with a lowermost surface of a backside contact that is in direct contact with the region of source/drain material of at least one of the transistor gates.

Additional embodiments of the present disclosure include a method for making a semiconductor component. The method includes forming an opening between two transistor gates such that the opening is delimited by an uppermost surface that is substantially coplanar with an uppermost surface of a region of source/drain material of one of the two transistor gates and such that the opening is open through a region of backside interlayer dielectric material. The method further includes filling the opening with dielectric material to form a diffusion break having a lowermost surface that is substantially coplanar with a lowermost surface of the region of backside interlayer dielectric material. The method further includes forming a backside contact in direct contact with one of the two transistor gates and having a lowermost surface that is substantially coplanar with the lowermost surface of the diffusion break.

Additional embodiments of the present disclosure include a method of forming a semiconductor component. The method includes removing one of a plurality of regions of source/drain material to form an opening delimited by an uppermost surface that is substantially coplanar with an uppermost surface of a remaining region of source/drain material. The method further includes filling the opening with dielectric material to form a diffusion break having a lowermost surface that is substantially coplanar with a lowermost surface of a region of backside interlayer dielectric material. The method further includes forming a backside interconnect in direct contact with the lowermost surface of the diffusion break.

Additional embodiments of the present disclosure include a method of forming a semiconductor component. The method includes forming a frontside contact in direct contact with a first region of source/drain material of a plurality of regions of source/drain material. The method further includes removing a second region of source/drain material of the plurality of regions of source/drain material to form an opening delimited by an uppermost surface that is substantially coplanar with an uppermost surface of the first region of source/drain material. The method further includes filling the opening with dielectric material to form a diffusion break having a lowermost surface that is substantially coplanar with a lowermost surface of a backside contact that is in direct contact with a third region of source/drain material of the plurality of regions of source/drain material.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of typical embodiments and do not limit the disclosure.

FIG. 3I illustrates an example of a component following the performance of a portion of the example method of FIG. 2, in accordance with embodiments of the present disclosure.

Figure 1A:
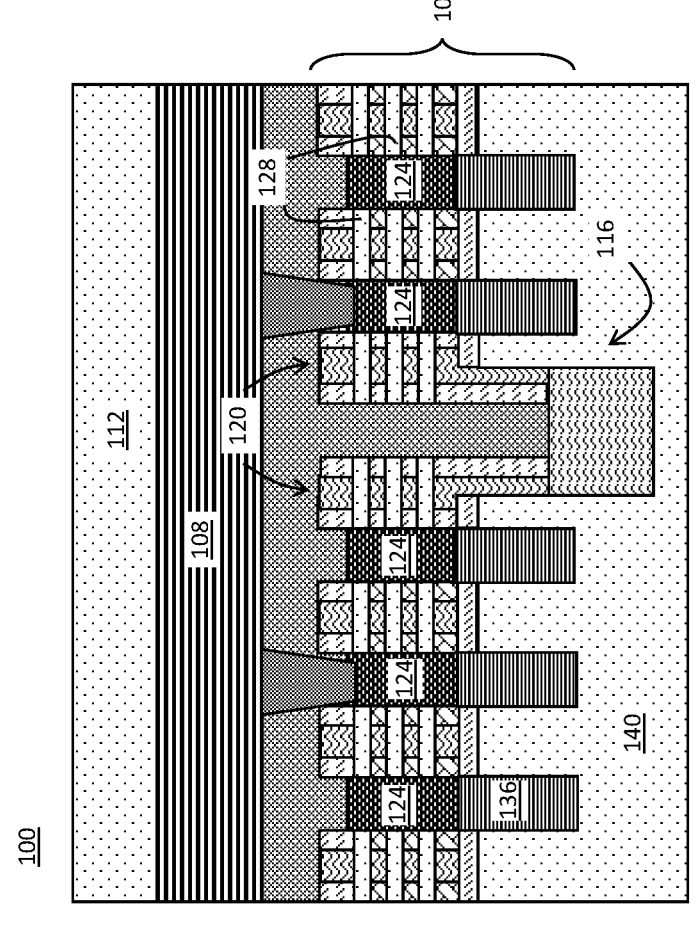
FIG. 1A illustrates an example of a component including a diffusion break following the performance of a portion of a fabrication method, in accordance with embodiments of the present disclosure.

While the embodiments described herein are amenable to various modifications and alternative forms, specifics thereof have been shown by way of example in the drawings and will be described in detail. It should be understood, however, that the particular embodiments described are not to be taken in a limiting sense. On the contrary, the intention is to cover all modifications, equivalents, and alternatives falling within the spirit and scope of the invention.

DETAILED DESCRIPTION

Aspects of the present disclosure relate generally to the electrical, electronic, and computer fields. In particular, the present disclosure relates to semiconductor devices. While the present disclosure is not necessarily limited to such applications, various aspects of the disclosure may be appreciated through a discussion of various examples using this context.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

Turning now to an overview of technologies that are more specifically relevant to aspects of the present disclosure, a transistor is a semiconductor device used to amplify or switch electrical signals and power. It is one of the basic building blocks of modern electronics and is composed of semiconductor material, usually with at least three terminals for connection to an electronic circuit. A voltage or current applied to one pair of the transistor's terminals controls the current through another pair of terminals. An integrated circuit (IC) is a set of electronic circuits, including transistors and other electronic components, integrated together onto a chip. During the fabrication of ICs, various processes are used to form interconnects, such as lines and vias, as well as transistors and other electronic components for a semiconductor chip or micro-chip that will be packaged into an IC. These processes fall into three general categories, namely, deposition, removal/etching, and patterning/lithography.

Deposition is any process that grows, coats, or otherwise transfers a material onto the substrate. Available technologies include physical vapor deposition (PVD), chemical vapor deposition (CVD), electrochemical deposition (ECD), molecular beam epitaxy (MBE) and more recently, atomic layer deposition (ALD) among others. Another deposition technology is plasma enhanced chemical vapor deposition (PECVD), which is a process which uses the energy within the plasma to induce reactions at the substrate surface that would otherwise require higher temperatures associated with conventional CVD. Energetic ion bombardment during PECVD deposition can also improve the film's electrical and mechanical properties.

Removal/etching is any process that removes material from the substrate. Examples include etch processes (either wet or dry), chemical-mechanical planarization (CMP), and the like. One example of a removal process is ion beam etching (IBE). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching (RIE). In general, RIE uses chemically reactive plasma to remove material deposited on substrates. With RIE the plasma is generated under low pressure (vacuum) by an electromagnetic field. High-energy ions from the RIE plasma attack the substrate surface and react with it to remove material.

Patterning/lithography is the formation of three-dimensional relief images or patterns on the semiconductor substrate for subsequent transfer of the pattern to a layer arranged beneath the pattern. In semiconductor lithography, the patterns are formed by a light sensitive polymer called a photoresist.

To build the complex structures that make up a transistor and the many interconnects that connect the millions of transistors of a circuit, lithography and etch pattern transfer steps are repeated multiple times. Each pattern being printed on the substrate is aligned to previously formed patterns, and gradually the conductive and insulative regions are built up to form the final device. These processes can be used in different combinations and orders to form various electronic components and interconnect structures.

Front-end-of-line (FEOL) refers to those elements and components that make up the transistors and other functional electronic components of an IC. In contrast, back-end-of-line (BEOL) refers to interconnects and their supporting components that provide electrical connection to and/or between FEOL devices. Additionally, BEOL components also extend all the way back to power delivery networks which deliver power to the IC and/or chip. Middle-of-line (MOL), therefore, refers to a series of contact structures electrically connecting the BEOL and FEOL.

Additionally, during IC fabrication, processes that are performed on a first side of the semiconductor are referred to as "frontside" processes, and the structures that result from those processes can be referred to as "frontside" structures. Similarly, processes that are performed on a second side of the semiconductor are referred to as "backside" processes, and the structures that result from those processes can be referred to as "backside" structures. Notably, the concept of FEOL and BEOL is distinct from frontside and backside. Accordingly, a FEOL structure could be either a frontside or a backside structure, depending on how it was formed relative to the semiconductor.

Figure 1B:
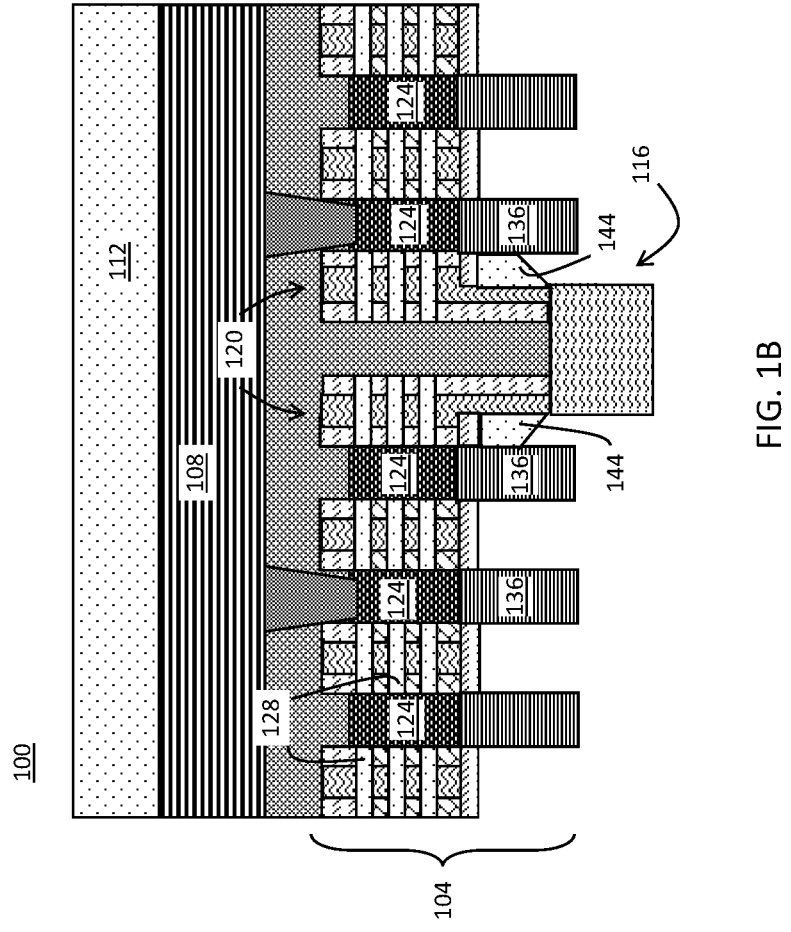
FIG. 1B illustrates the component of FIG. 1B following the performance of a further portion of a fabrication method, in accordance with embodiments of the present disclosure.

FIGS. 1A and 1B illustrate an example semiconductor component 100 after the performance of some IC fabrication processes. In particular, the semiconductor component 100 includes FEOL components 104 and BEOL components 108 on a carrier wafer 112. The FEOL components 104 of the semiconductor component 100 include a diffusion break 116 arranged between two inactive transistor gates 120. The diffusion break 116 is made of an inner layer dielectric material that also extends to the BEOL components 108. The FEOL components 104 further include a plurality of transistors, each having a region of source/drain epitaxy material 124 that acts as a source, a region of source/drain epitaxy material 124 that acts as a drain, and a plurality of silicon sheets 128 that act as a gate between the source and drain.

Notably, the inactive transistor gates 120 that are adjacent to the diffusion break 116 cannot act as a gate, because they cannot connect a source and a drain as one side is occupied by the diffusion break 116. Accordingly, the diffusion break 116 acts as a circuit break between active regions of the IC of the semiconductor component 100.

Additionally, due to the fabrication status of the semiconductor component 100 that is illustrated in FIGS. 1A and 1B, each region of source/drain epitaxy material 124 is shown in direct contact with a placeholder 136. The placeholders 136 can be formed of, for example, SiGe, and some are selectively removed during subsequent fabrication processes to enable the selective formation of backside contacts in direct contact with particular regions of source/drain epitaxy material 124, depending on the specific configuration of the semiconductor component 100.

As shown in FIG. 1A, the placeholders 136 are encapsulated in a backside layer of silicon 140, due to the fabrication stage being depicted. As shown in FIG. 1B, the layer of silicon is removed from the backside of the semiconductor component 100 to enable further fabrication processes such as, eventually, the formation of backside contacts. However, as shown, residual portions of silicon 144 remain between the diffusion break 116 and each adjacent placeholder 136. Such residual portions of silicon 144 remain, despite the fact that the rest of the backside layer of silicon has been removed, because of the relatively small spacing between the diffusion break 116 and each placeholder 136 that is adjacent to the diffusion break 116. As shown in FIGS. 1A and 1B, the spacing between other placeholders 136 is wider than that between the diffusion break 116 and each adjacent placeholder 136.

The residual portions of silicon 144 are problematic because they can conduct current, causing current leakage and enabling some electrical connection between structures that are intended to be isolated from one another. Additionally, the residual portions of silicon 144 can also cause additional capacitance in the structure.

Embodiments of the present disclosure may overcome these and other drawbacks of existing solutions by forming diffusion breaks from the backside of semiconductor components. Such embodiments enable uniform spacing between the diffusion break and placeholders, thereby avoiding the relatively small spacing between the diffusion break and adjacent placeholders, thereby avoiding the problematic residual portions of silicon between the diffusion break and adjacent placeholders.

Figure 2:
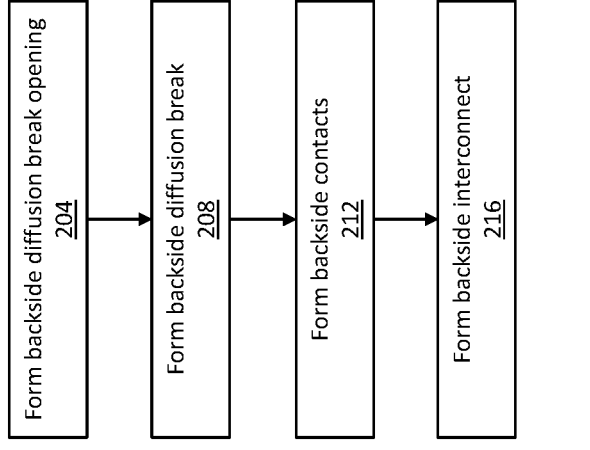
FIG. 2 illustrates a flowchart of an example method for forming a semiconductor component, in accordance with embodiments of the present disclosure.

FIG. 2 depicts an example method 200 of forming a semiconductor component in accordance with embodiments of the present disclosure. The following description discloses a method of making a semiconductor component according to the disclosure. Additionally, the following description discloses the structure of a semiconductor component produced by the performance of the disclosed method. In accordance with various embodiments of the present disclosure, each operation of the method 200 can include a number of sub-operations. In various embodiments of the present disclosure, sub-operations may be performed as part of different operations than as described herein, combined as different or additional operations than as described herein, and/or in a different order than as described herein. Additionally, in various embodiments of the present disclosure, the method 200 may be described as including more or fewer operations than as described herein.

Figure 3A:
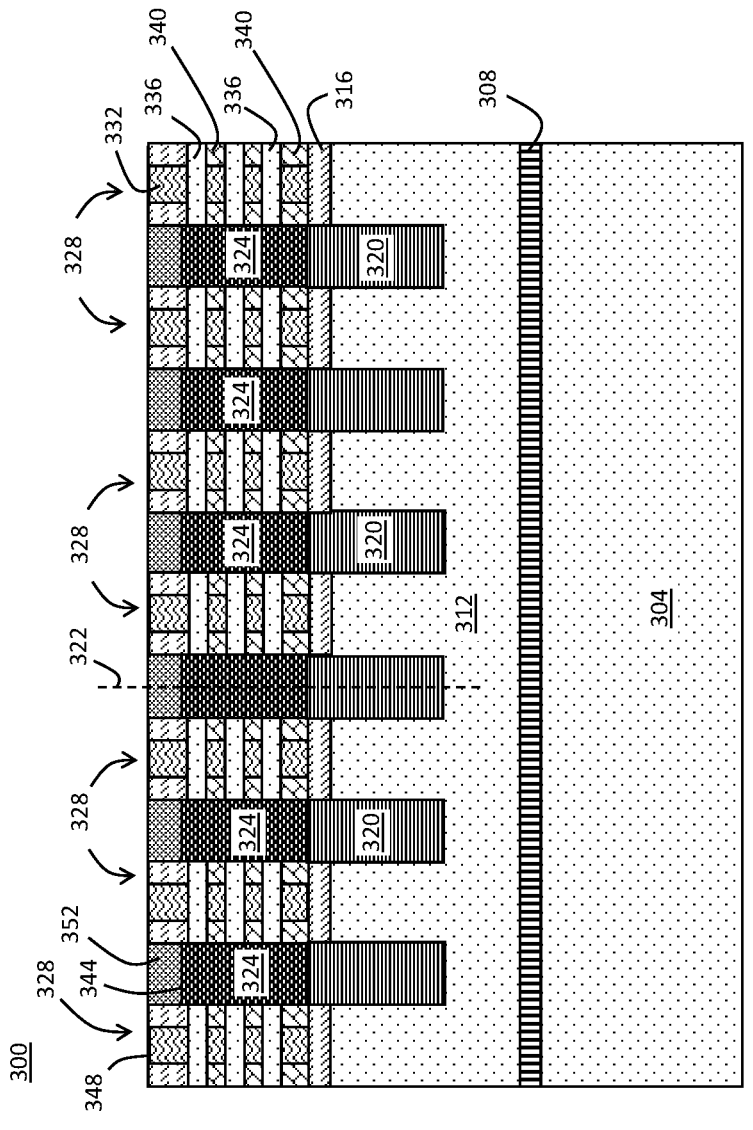
FIG. 3A illustrates an example of a component at a stage of the performance of the example method of FIG. 2, in accordance with embodiments of the present disclosure.

In accordance with at least some embodiments of the present disclosure, some portions of a semiconductor device are formed prior to beginning the method 200. In other words, in accordance with at least some embodiments, some portions of a semiconductor device are provided or prepared prior to beginning the method 200. In accordance with at least some alternative embodiments of the present disclosure, the method 200 can include providing or preparing such portions of the semiconductor device. FIG. 3A illustrates an example of a semiconductor component 300 having some such portions formed prior to beginning the method 200 or in the provision or preparing of the semiconductor device in the course of the performance of the method 200.

More specifically, as shown in FIG. 3A, such a semiconductor component 300 includes a silicon substrate 304, an etch stop layer 308 formed on the silicon substrate 304, and a silicon layer 312 formed on the etch stop layer 308. The semiconductor component 300 further includes a bottom dielectric isolation (BDI) layer 316 formed on the silicon layer 312 and a plurality of placeholders 320 formed through the BDI layer 316 and into the silicon layer 312. The placeholders 320 can each be formed of SiGe, and the placeholders 320 are each equally spaced from one another. More specifically, each placeholder 320 is substantially symmetrical about a vertical axis 322 and the spacing between the vertical axis 322 of each placeholder 320 and the vertical axis 322 of each adjacent placeholder 320 is uniform across the entirety of the semiconductor component 300.

As used herein, the term "substantially" refers to the inclusion of deviations that do not affect the intended outcome of the term that it modifies. For example, a surface that is substantially vertical includes a surface that is not exactly vertical but which does not deviate from being exactly vertical to an extent that affects the intended outcome of the vertical nature of the surface. Similarly, surfaces which are substantially parallel include surfaces that are not exactly parallel but which do not deviate from being exactly parallel to an extent that affects the intended outcome of the parallel nature of the surfaces.

In accordance with some embodiments of the present disclosure, the spacings between the vertical axes 322 of the placeholders 320 is not substantially uniform across the entirety of the semiconductor component 300. Additionally, in accordance with some embodiments of the present disclosure, the spacings can be larger than the spacing illustrated in FIG. 3A. Moreover, in accordance with some embodiments of the present disclosure, the spacings can be non-uniform and some or all of them can be larger than the spacing illustrated in FIG. 3A.

In any of the above embodiments, the arrangement of the placeholders 320 is greater than a minimum distance which can lead to residual portions of silicon remaining between structures following the removal of a silicon layer from the structures. The minimum distance can also be referred to as a minimum spacing. The minimum spacing is, for example, 10 nanometers. Accordingly, by avoiding spaces smaller than the minimum spacing between placeholders 320, residual portions of silicon between placeholders and subsequent structures are avoided. In accordance with at least one embodiment of the present disclosure, the placeholders

320 are arranged such that no spacing between adjacent placeholders 320 is less than 10 nanometers.

Each of the placeholders 320 has an uppermost surface which is substantially coplanar with an uppermost surface of the BDI layer 316. As used herein, the term "coplanar" refers to two surfaces that lie in a common plane. In other words, two surfaces are coplanar if there exists a geometric plane that contains all the points of both of the surfaces. Accordingly, two surfaces may be referred to as being substantially coplanar despite deviations from coplanarity, so long as those deviations do not impact the desired result of the coplanarity.

In accordance with some embodiments of the present disclosure, the semiconductor component 300 may not include a BDI layer 316. In such embodiments, the uppermost surface of the placeholders 320 is substantially coplanar with the lowermost surfaces of the bottommost inner spacers 340.

Additionally, the uppermost surface of each placeholder 320 is in direct contact with a lowermost surface of a corresponding region of source/drain epitaxy material 324. Each region of source/drain epitaxy material 324 is separated from adjacent regions of source/drain epitaxy material 324 by a transistor gate 328. Each transistor gate 328 includes a gate 332 that is in direct contact with a plurality of silicon sheets 336. Each gate 332 includes a thin gate insulator such as, for example, HfO2. Each gate 332 further includes gate metals, like work function metals such as, for example, tungsten. Accordingly, the thin gate insulator insulate the work function metal, thereby preventing other components from shorting with the work function metal of the gate.

The gates 332 are not in direct contact with the adjacent regions of source/drain epitaxy material 324, but are separated therefrom by inner spacers 340 which also separate the silicon sheets 336 from one another. The silicon sheets 336, however, are in direct contact with each of the regions of source/drain epitaxy material 324 that are separated by the corresponding transistor gate 328.

Each of the regions of source/drain epitaxy material 324 has an uppermost surface 344 and each transistor gate 328 has an uppermost surface 348. The uppermost surfaces 344 of the regions of source/drain epitaxy material 324 are in direct contact with an inner layer dielectric (ILD) 352 which has an uppermost surface that is substantially coplanar with the uppermost surfaces 348 of the transistor gates 328.

Accordingly, as shown in FIG. 3A, the semiconductor component 300 includes FEOL devices formed on the frontside relative to the silicon substrate 304. As mentioned above, the semiconductor component 300 shown in FIG. 3A depicts an example structure that can be provided or prepared prior to beginning the method 200. Alternatively, any or all features of the semiconductor component 300 can be provided or prepared as part of the performance of the method 200.

As shown in FIG. 2, in accordance with at least some embodiments of the present disclosure, the performance of the method 200 begins with operation 204, wherein a backside diffusion break opening is formed. In accordance with embodiments of the present disclosure, the performance of operation 204 can include the performance of a number of sub-operations.

In accordance with at least one embodiment of the present disclosure, the performance of operation 204 includes forming further frontside components on the semiconductor component 300 shown in FIG. 3A. In such embodiments, the performance of operation 204 further includes applying an ILD layer on the FEOL devices, forming MOL contacts in the ILD layer, forming BEOL components on the ILD layer in contact with the MOL contacts, and forming a carrier wafer on the BEOL components.

Figure 3B:
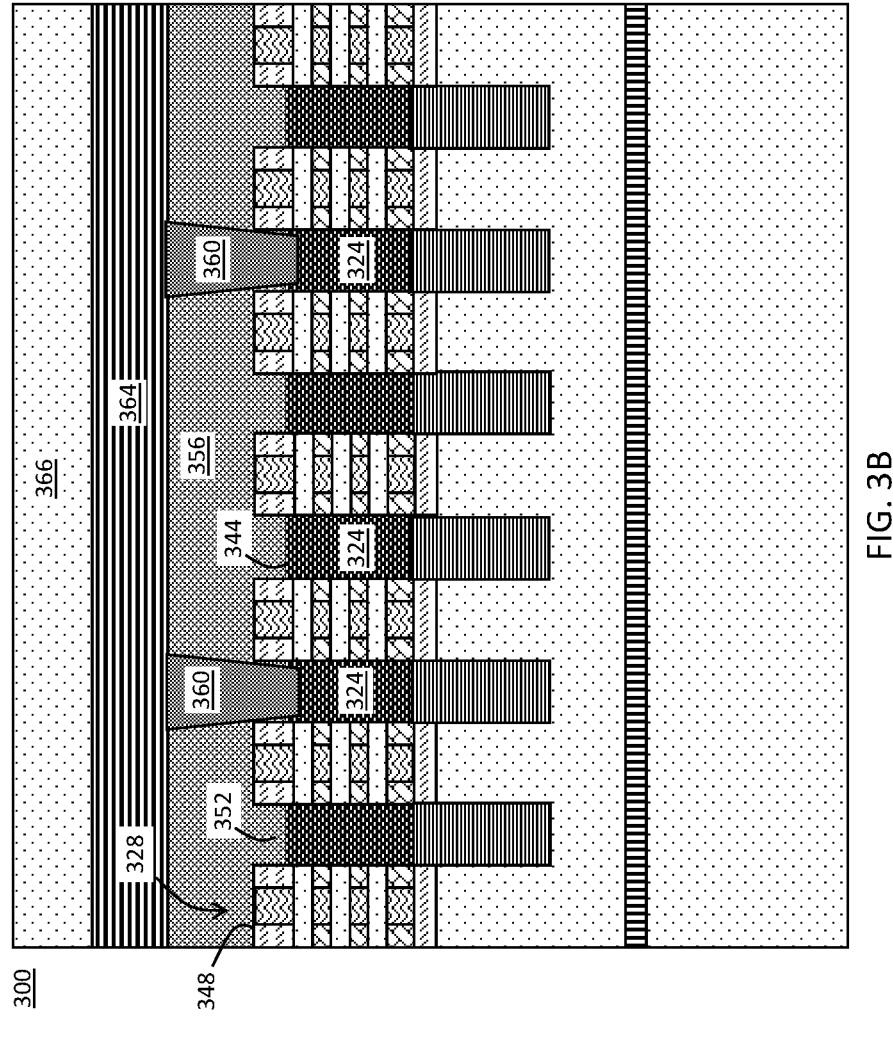
FIG. 3B illustrates an example of a component following the performance of a portion of the example method of FIG. 2, in accordance with embodiments of the present disclosure.

FIG. 3B depicts the semiconductor component 300 following the performance of this portion of operation 204. Accordingly, FIG. 3B illustrates an ILD layer 356 in direct contact with the uppermost surfaces of the ILD 352 and the uppermost surfaces 348 of the transistor gates 328. In accordance with some embodiments of the present disclosure, the ILD layer 356 becomes integrally formed with the ILD 352 such that the ILD layer 356 and the ILD 352 are inseparable from one another and indistinguishable from one another.

FIG. 3B further illustrates frontside contacts 360 formed in direct contact with the uppermost surfaces 344 of selected regions of source/drain epitaxy material 324 and in direct contact with a BEOL layer 364 that is formed on top of the ILD layer 356. Accordingly, the frontside contacts 360 are configured to establish electrical connection between the BEOL layer 364 and respective regions of source/drain epitaxy material 324. For simplicity, the BEOL layer 364 is schematically illustrated as a single layer although it may include a large number and variety of BEOL structures. The BEOL layer 364 is in direct contact with a carrier wafer 366 formed thereon.

In accordance with at least one embodiment of the present disclosure, the performance of operation 204 further includes performing a wafer flip and a substrate removal.

Figure 3C:
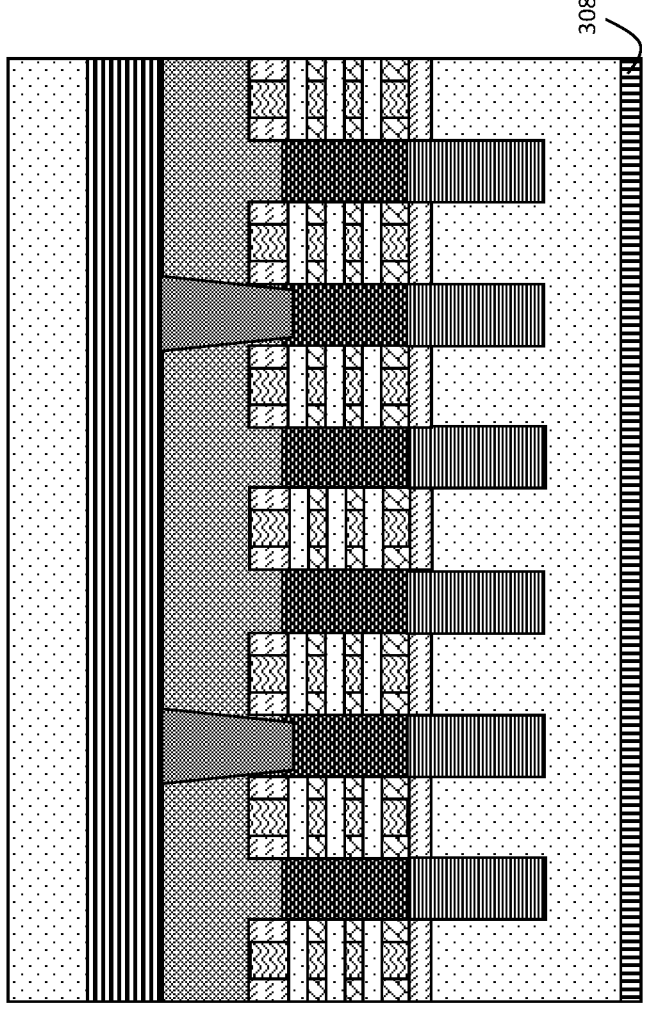
FIG. 3C illustrates an example of a component following the performance of a portion of the example method of FIG. 2, in accordance with embodiments of the present disclosure.

FIG. 3C illustrates the semiconductor component 300 following the performance of this portion of operation 204. Accordingly, FIG. 3C illustrates that the silicon substrate 304 (shown in FIG. 3A) has been removed from the semiconductor component 300 such that the etch stop layer 308 is exposed. For simplicity and continuity in the figures, the wafer flip is not illustrated in FIG. 3C. However, processes and operations performed after the wafer flip of operation 204 are performed on the backside of the semiconductor component.

In accordance with at least one embodiment of the present disclosure, the performance of operation 204 further includes performing an etch stop layer removal.

Figure 3D:
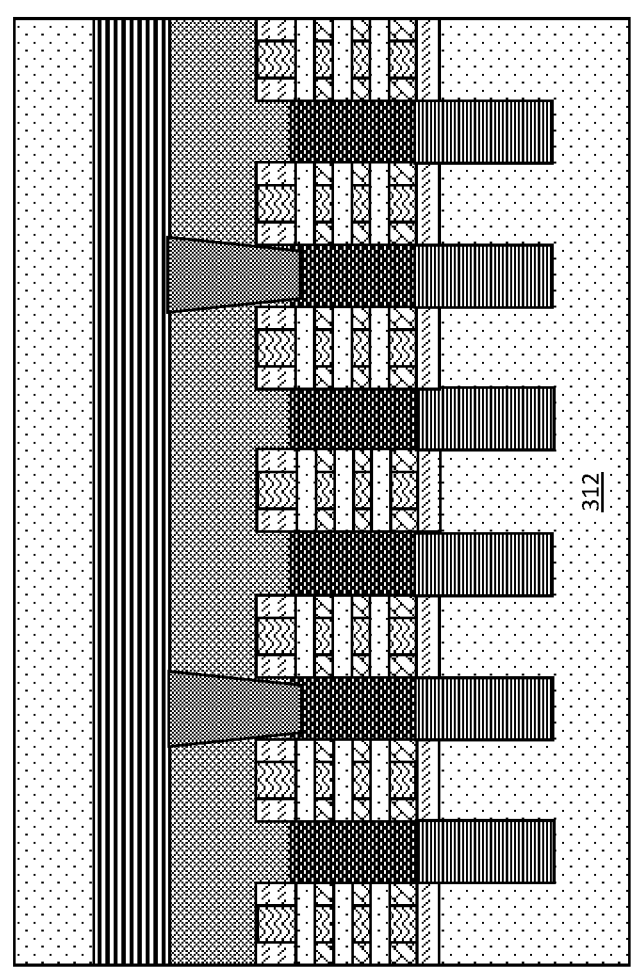
FIG. 3D illustrates an example of a component following the performance of a portion of the example method of FIG. 2, in accordance with embodiments of the present disclosure.

FIG. 3D illustrates the semiconductor component 300 following the performance of this portion of operation 204. Accordingly, FIG. 3D illustrates that the etch stop layer 308 (shown in FIG. 3C) has been removed from the semiconductor component 300 such that the silicon layer 312 is exposed.

In accordance with at least one embodiment of the present disclosure, the performance of operation 204 further includes removing the silicon layer to expose the placeholders and the BDI layer from the backside of the semiconductor component.

Figure 3E:
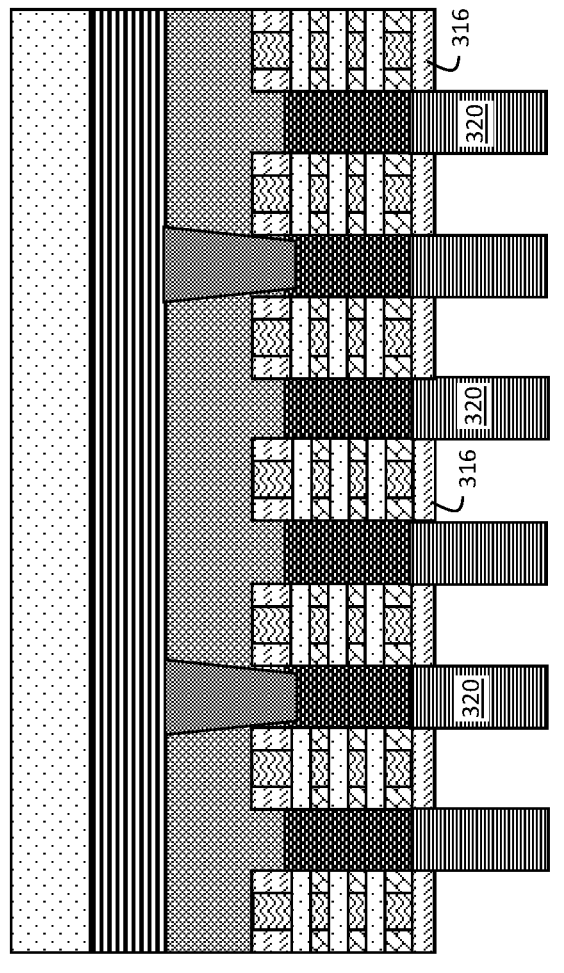
FIG. 3E illustrates an example of a component following the performance of a portion of the example method of FIG. 2, in accordance with embodiments of the present disclosure.

FIG. 3E illustrates the semiconductor component 300 following the performance of this portion of operation 204. Accordingly, FIG. 3E illustrates that the silicon layer 312 (shown in FIG. 3D) has been removed from the semiconductor component 300 such that the placeholders 320 and BDI layer 316 are exposed from the backside of the semiconductor component 300.

Notably, in contrast with the semiconductor component 100 shown in FIG. 1B, the removal of the silicon layer 312 from the semiconductor component 300 does not leave residual portions of silicon on the BDI layer 316. This clean and complete removal of the silicon layer 312 is enabled by the avoidance of very small spacings between each of the placeholders 320 and the lack of diffusion break in the semiconductor component 300 at the time that the silicon layer 312 is removed. Accordingly, unlike the semiconductor component 100, there is no very small spacing between the placeholders 320 and a diffusion break that causes the residual portions of silicon to remain when the silicon layer 312 is removed.

In accordance with at least one embodiment of the present disclosure, the performance of operation 204 further includes forming a backside ILD layer on the semiconductor component such that the backside ILD layer covers the placeholders and BDI layer.

Figure 3F:
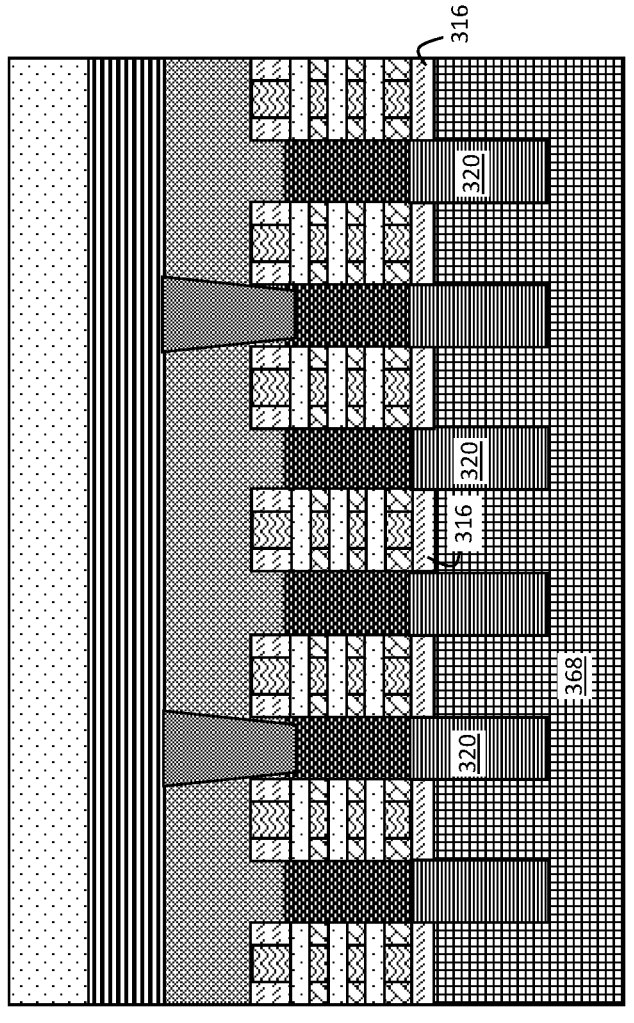
FIG. 3F illustrates an example of a component following the performance of a portion of the example method of FIG. 2, in accordance with embodiments of the present disclosure.

FIG. 3F illustrates the semiconductor component 300 following the performance of this portion of the operation 204. Accordingly, FIG. 3F illustrates a backside ILD layer 368 covering the placeholders 320 and the ILD layer 316.

In accordance with at least one embodiment of the present disclosure, the performance of operation 204 further includes patterning a backside diffusion break cavity in the backside ILD layer. More specifically, such embodiments include masking a portion of the backside ILD layer and performing a material removal process, such as an etch, to remove a portion of the backside ILD layer that was not covered by the mask. Notably, the backside diffusion break cavity is formed so as to be aligned with a placeholder and to expose the placeholder within the backside ILD layer. As used herein, the term "aligned" refers to the placement of separate objects such that the vertical axes of the objects are made substantially coincident with one another. As described in further detail below, the placeholder with which the backside diffusion break cavity is aligned will be removed during the performance of a subsequent process to complete the opening in which the backside diffusion break will be formed.

In accordance with at least one embodiment of the present disclosure, forming the backside diffusion break cavity includes removing material of the backside ILD layer to a lowermost surface of the placeholder with which it is aligned. In accordance with at least one alternative embodiment of the present disclosure, forming the backside diffusion break cavity further includes removing at least a portion of the placeholder with which the backside diffusion break cavity is aligned. In such embodiments, a lowermost surface of the placeholder aligned with the backside diffusion break cavity is no longer substantially coplanar with the lowermost surfaces of the rest of the placeholders following the formation of the backside diffusion break cavity.

In accordance with at least one embodiment of the present disclosure, the backside diffusion break cavity is tapered such that it is wider at the lowermost surface of the backside ILD layer and is narrower at the placeholder.

Figure 3G:
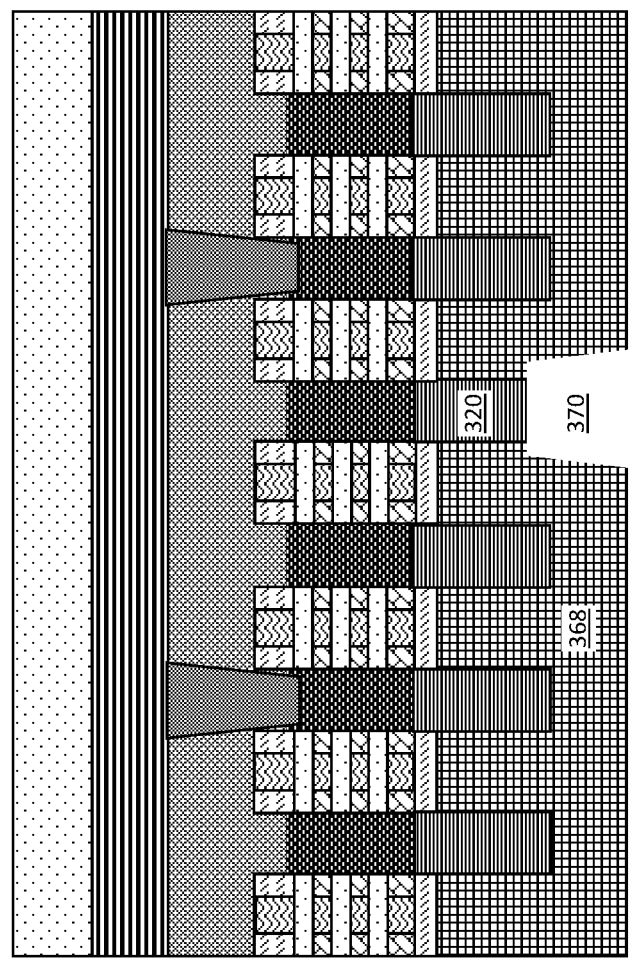
FIG. 3G illustrates an example of a component following the performance of a portion of the example method of FIG. 2, in accordance with embodiments of the present disclosure.

FIG. 3G illustrates the semiconductor component 300 following the performance of this portion of the operation 204. Accordingly, FIG. 3G illustrates a cavity 370 formed in the backside ILD layer 368. As shown, the cavity 370 is aligned with a placeholder 320. In the embodiment shown in FIG. 3G, the formation of the cavity 370 has included removing a portion of the placeholder 320 in addition to the backside ILD layer 368.

Notably, a backside overlay is typically more challenging than a frontside overlay. In particular, aligning a diffusion break opening with the desired corresponding region of source/drain epitaxy material is difficult and often inaccurate. Accordingly, forming a backside diffusion break is typically more challenging than forming a frontside diffusion break. However, because embodiments of the present disclosure include a placeholder 320 underneath each region of source/drain epitaxy material 324, the overlay misalignment margin is greatly increased. As shown in FIG. 3G, for example, even if the cavity 370 were misaligned to the right or the left of the vertical axis of the placeholder 320, as long as it lands on the placeholder 320, the accurate removal of the corresponding region of source/drain epitaxy material is enabled.

In accordance with at least one embodiment of the present disclosure, the performance of operation 204 further includes the enlargement of the backside diffusion break cavity into a backside diffusion break opening. More specifically, the backside diffusion break opening is formed through the backside diffusion break cavity such that it is a continuation of the backside diffusion break cavity and further enlarges the backside diffusion break cavity into an opening. In particular, the backside diffusion break opening is formed by removing the placeholder with which the backside diffusion break cavity was aligned as well as the region of source/drain epitaxy material that is in direct contact with that placeholder. As a result, the backside diffusion break opening extends from the lowermost surface of the backside ILD layer to the uppermost surface of the regions of source/drain epitaxy material.

Figure 3H:
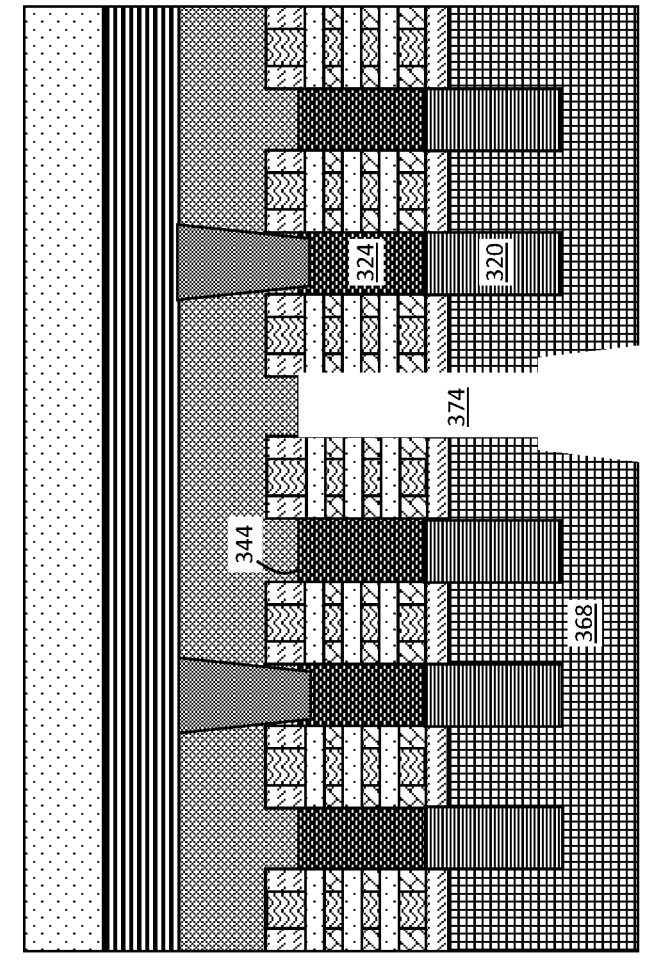
FIG. 3H illustrates an example of a component following the performance of a portion of the example method of FIG. 2, in accordance with embodiments of the present disclosure.
Figure 31:
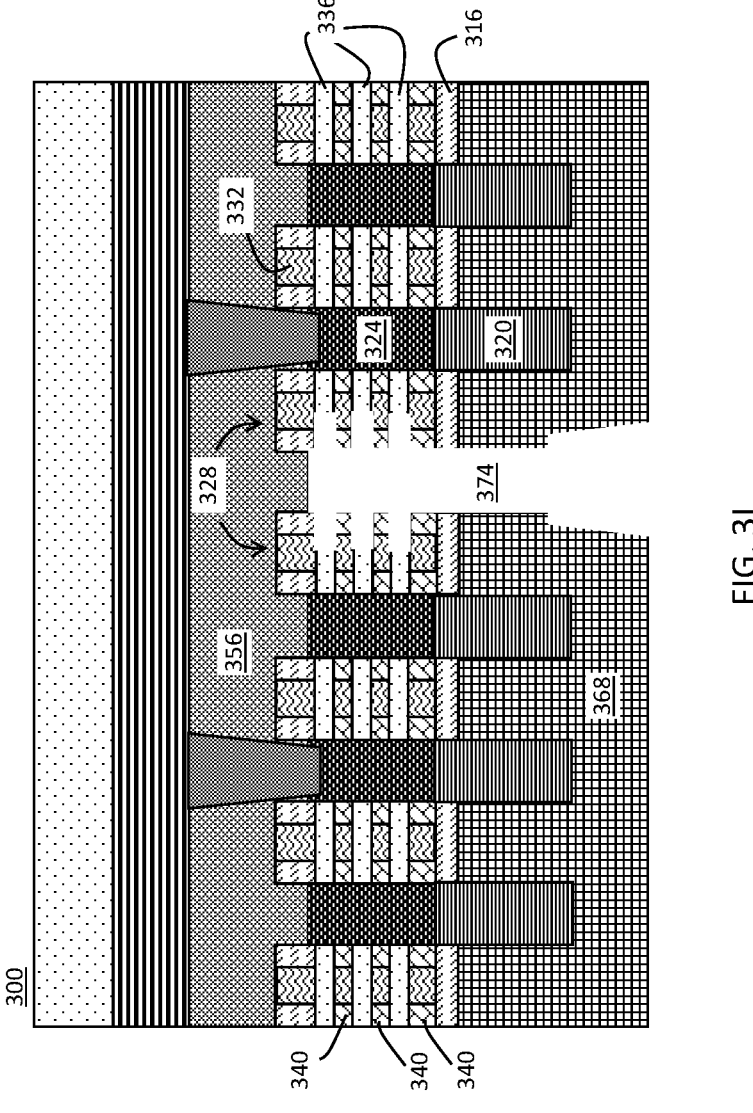

FIG. 3H illustrates the semiconductor component 300 following the performance of this portion of operation 204. Accordingly, FIG. 3H illustrates the semiconductor component 300 having a backside diffusion break opening 374 formed by the removal of the placeholder 320 and corresponding region of source/drain epitaxy material 324 that were aligned with the backside diffusion break cavity 370 shown in FIG. 3G. Accordingly, the backside diffusion break opening 374 extends from the lowermost side of the backside ILD layer 368 to the uppermost surfaces 344 of the regions of source/drain epitaxy material 324.

In accordance with some embodiments of the present disclosure, the performance of operation 204 is complete following the enlargement of the backside diffusion break cavity into the backside diffusion break opening 374 shown in FIG. 3H. In accordance with at least one alternative embodiment, however, the performance of operation 204 further includes the performance of a further etch through the backside diffusion break opening to remove a portion of the silicon sheets that were in direct contact with the removed region of source/drain epitaxy material. In such embodiments, the performance of operation 204 is complete following the partial removal of the silicon sheets that were in direct contact with the removed region of source/drain epitaxy material.

FIG. 3I illustrates the semiconductor component 300 following the performance of this portion of operation 204. Accordingly, FIG. 3I shows the backside diffusion break opening 374 extending into the transistor channels adjacent to the removed placeholder 320 and corresponding region of source/drain epitaxy material 324 due to the removal of portions of the silicon sheets 336 of the transistor adjacent to the backside diffusion break opening 374. The backside diffusion break opening 374 shown in FIG. 3I is delimited by the backside ILD layer 368, the BDI layer 316, the gates 332 of the adjacent transistor gates 328, the inner spacers 340 of the adjacent transistor gates 328, the remaining portions of the silicon sheets 336 of the adjacent transistor gates 328, and the ILD layer 356. In other words, the backside ILD layer 368, the BDI layer 316, the gates 332 of the adjacent transistor gates 328, the inner spacers 340 of the adjacent transistor gates 328, the remaining portions of the silicon sheets 336 of the adjacent transistor gates 328, and the ILD layer 356 form boundaries of the backside diffusion break opening 374.

Returning to FIG. 2, following the performance of operation 204, the method 200 proceeds with the performance of operation 208, wherein a backside diffusion break is formed. More specifically, the backside diffusion break is formed by filling the backside diffusion break opening with a dielectric material to form a circuit break between adjacent circuits in the semiconductor component.

Figure 3J:
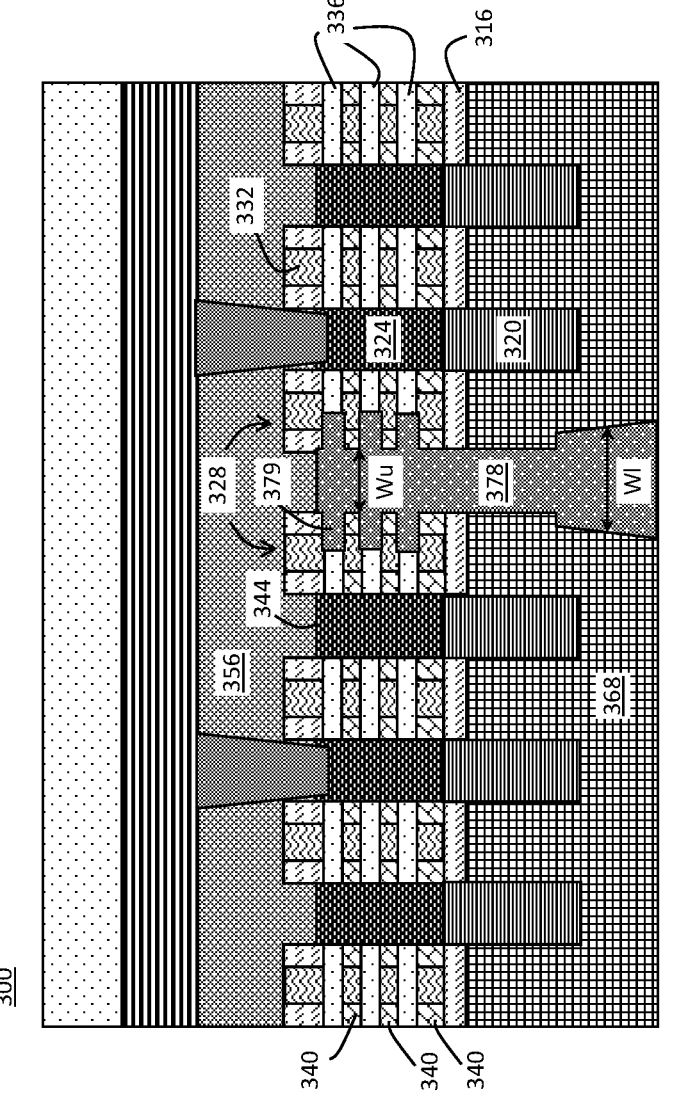
FIG. 3J illustrates an example of a component following the performance of a portion of the example method of FIG. 2, in accordance with embodiments of the present disclosure.

FIG. 3J illustrates the semiconductor component 300 following the performance of operation 208. As shown, the semiconductor component 300 includes a backside diffusion break 378 formed in the space that was previously the backside diffusion break opening 374 (shown in FIG. 3I). Accordingly, the backside diffusion break 378 is in direct contact with the backside ILD layer 368, the BDI layer 316, the gates 332 of the adjacent transistor gates 328, the inner spacers 340 of the adjacent transistor gates 328, the remaining portions of the silicon sheets 336 of the adjacent transistor gates 328, and the ILD layer 356. Additionally, a lowermost surface of the backside diffusion break 378 is substantially coplanar with the lowermost surface of the backside ILD layer 368 and an uppermost surface of the backside diffusion break 378 is substantially coplanar with the uppermost surfaces 344 of the regions of source/drain epitaxy material 324.

Additionally, the backside diffusion break 378 can be considered to have an upper portion formed in the space that was previously occupied by the removed region of source/drain material 324 and placeholder 320 and a lower portion formed in the space that was previously formed as the backside diffusion break cavity 370 (shown in FIG. 3G). The upper portion is delimited by the uppermost surface of the diffusion break and has an upper width Wu. The lower portion is delimited by the lowermost surface of the diffusion break and has a lower width W1 that is different than the upper width Wu. As shown, the upper width Wu is substantially equal to the width of the regions of source/drain material 324 due to the formation of the backside diffusion break 378 in a space that was previously occupied by a removed region of source/drain material 324.

Notably, because the upper portion of the backside diffusion break 378 is formed in the space that was previously occupied by the removed region of source/drain material 324 and placeholder 320, and because the removed region of source/drain material 324 and placeholder 320 were substantially symmetrical about a vertical axis 322 (shown in FIG. 3A), the upper portion of the backside diffusion break 378 is substantially symmetrical about the same vertical axis. Furthermore, as shown in FIG. 3J, the lower portion of the backside diffusion break 378 is also substantially symmetrical about the same vertical axis. This vertical axis can be referred to herein as a diffusion break axis. The distance between the diffusion break axis and each adjacent vertical axis and the distance between the vertical axes of adjacent regions of source/drain material 324 are all substantially equal to one another.

In accordance with at least one embodiment of the present disclosure, the dielectric material of the backside diffusion break 378 is different than the material of the ILD layer 356 such that the interface of the two different materials is substantially coplanar with the uppermost surfaces 344 of the regions of source/drain epitaxy material 324.

Notably, the transistor gates 328 that are adjacent to the backside diffusion break 378 are inactive transistor gates. They cannot act as gates, because they cannot connect a source and a drain as one side is occupied by the backside diffusion break 378. Accordingly, the backside diffusion break 378 acts as a circuit break between active regions of the IC of the semiconductor component 300. In other words, the backside diffusion break 378 is formed between the two inactive transistor gates 328.

As shown in FIG. 3J, the backside diffusion break 378 is in direct contact with the gate 332 of each of the inactive transistor gates 328. In particular, as noted above, the backside diffusion break 378 is substantially symmetrical about a diffusion break axis, and the backside diffusion break 378 includes extensions 379 that extend from the upper portion of the backside diffusion break 378 into the areas formed by the partial removal of the silicon sheets 336 of the adjacent transistor gates 328. Accordingly, the extensions extend farther from the vertical axis than the upper width Wu. As shown in FIG. 3J, it is the extensions of the backside diffusion break 378 that are in direct contact with the gate 332 of the inactive transistor gates 328.

Returning to FIG. 2, in accordance with at least one embodiment of the present disclosure, following the performance of operation 208, the method 200 proceeds with the performance of operation 212, wherein backside contacts are formed. In accordance with at least one embodiment of the present disclosure, the performance of operation 212 includes the performance of at least one sub-operation.

In accordance with at least one embodiment of the present disclosure, the performance of operation 212 includes forming backside contact cavities in the backside ILD layer. Like the backside diffusion break cavity, described above, the backside contact cavities can be formed by masking and etching specific areas of the backside ILD layer that are aligned with regions of source/drain material with which electrical contact will be made.

Figure 3K:
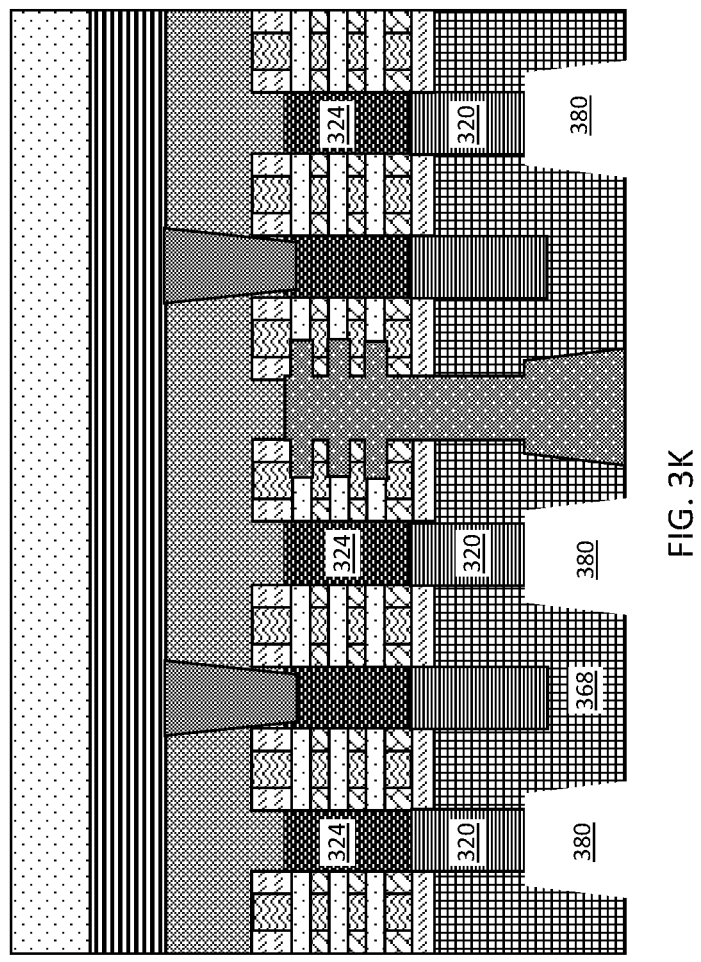
FIG. 3K illustrates an example of a component following the performance of a portion of the example method of FIG. 2, in accordance with embodiments of the present disclosure.

FIG. 3K illustrates the semiconductor component 300 following the performance of this portion of operation 212. As shown, backside contact cavities 380 have been formed in the backside ILD layer 368. In the embodiment shown in FIG. 3K, each of the backside contact cavities 380 has substantially the same dimensions and configuration as the backside diffusion break cavity 370 (shown in FIG. 3G). Accordingly, each backside contact cavity 380 extends from the lowermost surface of the backside ILD layer 368 to the placeholder 320 corresponding to the region of source/drain epitaxy material 324 with which electrical contact will be made.

In accordance with at least one embodiment of the present disclosure, the performance of operation 212 further includes the enlargement of the backside contact cavities into backside contact openings. More specifically, like the backside diffusion break opening, the backside contact openings are formed through the backside contact cavity such that they are continuations of the backside contact cavities and further enlarge the backside contact cavities into openings. In particular, the backside contact openings are formed by removing the placeholders with which they are aligned. As a result, the backside contact openings extend from the lowermost surface of the backside ILD layer to the lowermost surfaces of the corresponding regions of source/drain epitaxy material.

Figure 3L:
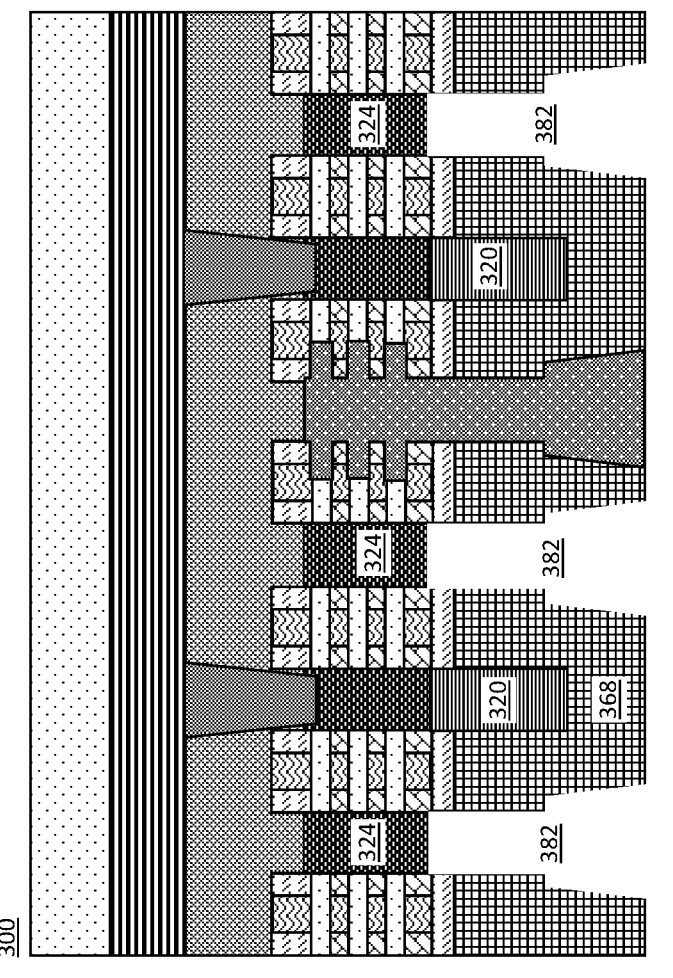
FIG. 3L illustrates an example of a component following the performance of a portion of the example method of FIG. 2, in accordance with embodiments of the present disclosure.

FIG. 3L illustrates the semiconductor component 300 following the performance of this portion of operation 204. Accordingly, FIG. 3L illustrates the semiconductor component 300 having backside contact openings 382 formed by the removal of the placeholders 320 corresponding to the regions of source/drain epitaxy material 324 with which electrical contact will be made.

In accordance with at least one embodiment of the present disclosure, the performance of operation 212 further includes filling the backside contact openings with conductive material to form backside contacts configured to establish electrical contact with the corresponding regions of source/drain epitaxy material with which they are in direct contact.

Figure 3M:
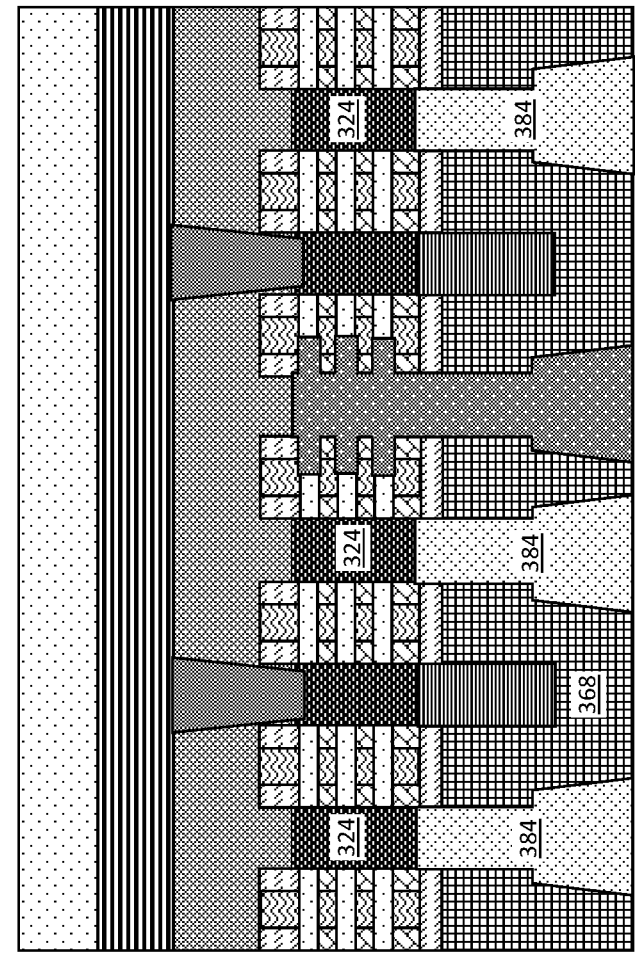
FIG. 3M illustrates an example of a component following the performance of a portion of the example method of FIG. 2, in accordance with embodiments of the present disclosure.

FIG. 3M illustrates the semiconductor component 300 following the performance of this portion of operation 212. Accordingly, the semiconductor component 300 includes backside contacts 384 extending from the lowermost surface of the backside ILD layer 368 to corresponding regions of source/drain epitaxy material 324. In particular, each backside contact 384 is in direct contact with a corresponding region of source/drain epitaxy material 324 and is configured to establish an electrical connection therewith. Notably, the region of source/drain epitaxy material 324 in direct contact with one of the inactive transistor gates 328 is in direct contact with one of the backside contacts 384.

Each of the backside contacts 384 is formed in the space that was previously occupied by a removed placeholder 320 and the space that was previously a backside contact cavity 380 (shown in FIG. 3K). Accordingly, because the placeholders 320 removed for the formation of the backside contacts were the same size and shape as the placeholders 320 removed for the formation of the backside diffusion break 378, and because the backside contact cavities 380 were substantially similar to the backside diffusion break cavity 370 (shown in FIG. 3G), the size and shape of each of the backside contacts 384 is substantially the same as the size and shape of the diffusion break 378 below the regions of source/drain epitaxy material 324. Accordingly, a width W1 (shown in FIG. 3J) of the lower portion of the backside diffusion break is substantially equal to a width of a backside contact 384.

Returning to FIG. 2, following the performance of operation 212, the method 200 continues with the performance of operation 216, wherein a backside interconnect is formed. In particular, the backside interconnect is formed in direct contact with each of the backside contacts such that each of the backside contacts establishes an electrical connection between a corresponding region of source/drain epitaxy material and the backside interconnect. Additionally, because the lowermost surfaces of the backside diffusion break, the backside ILD layer, and the backside contacts are substantially coplanar with one another, the backside interconnect is also formed in direct contact with the backside diffusion break and the backside ILD layer.

Figure 3N:
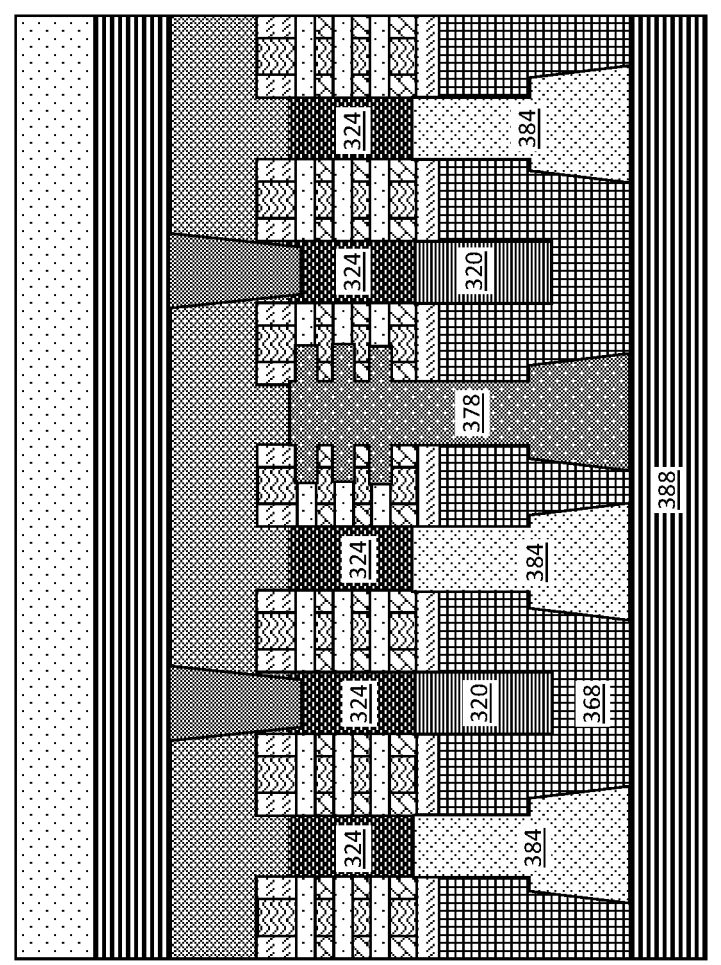
FIG. 3N illustrates an example of a component following the performance of a portion of the example method of FIG. 2, in accordance with embodiments of the present disclosure.

FIG. 3N illustrates the semiconductor component 300 following the performance of operation 216. Accordingly, as shown, the semiconductor component 300 includes a backside interconnect 388 formed in direct contact with the lowermost surfaces of each of the backside contacts 384, the backside ILD layer 368, and the backside diffusion break 378.

As shown, each backside contact 384 has a first contact width where it is in direct contact with the backside interconnect 388. Additionally, the backside diffusion break 378 has a second contact width where it is in direct contact with the backside interconnect 388. The first contact width and the second contact width are substantially the same.

Because the formation of the semiconductor component 300 shown in FIG. 3N begins with the semiconductor component 300 shown in FIG. 3A, having a plurality of placeholders 320 that are spaced more than a minimum distance from one another and corresponding regions of source/drain epitaxy material 324, and because the diffusion break 378 is formed from the backside of the semiconductor component 300 following the removal of one of the placeholders 320 and corresponding regions of source/drain epitaxy material 324, the semiconductor component 300 is able to be formed while avoiding residual silicon defects from backside silicon removal during the performance of method 200.

In addition to embodiments described above, other embodiments having fewer operational steps, more operational steps, or different operational steps are contemplated. Also, some embodiments may perform some or all of the above operational steps in a different order. Furthermore, multiple operations may occur at the same time or as an internal part of a larger process.

In the foregoing, reference is made to various embodiments. It should be understood, however, that this disclosure is not limited to the specifically described embodiments. Instead, any combination of the described features and elements, whether related to different embodiments or not, is contemplated to implement and practice this disclosure. Many modifications and variations may be apparent to those of ordinary skill in the art without departing from the scope and spirit of the described embodiments. Furthermore, although embodiments of this disclosure may achieve advantages over other possible solutions or over the prior art, whether or not a particular advantage is achieved by a given embodiment is not limiting of this disclosure. Thus, the described aspects, features, embodiments, and advantages are merely illustrative and are not considered elements or limitations of the appended claims except where explicitly recited in a claim(s).

The terminology used herein is for the purpose of describing particular embodiments only and is not intended to be limiting of the various embodiments. As used herein, the singular forms "a," "an," and "the" are intended to include the plural forms as well, unless the context clearly indicates otherwise. It will be further understood that the terms "includes" and/or "including," when used in this specification, specify the presence of the stated features, integers, steps, operations, elements, and/or components, but do not preclude the presence or addition of one or more other features, integers, steps, operations, elements, components, and/or groups thereof. In the previous detailed description of example embodiments of the various embodiments, reference was made to the accompanying drawings (where like numbers represent like elements), which form a part hereof, and in which is shown by way of illustration specific example embodiments in which the various embodiments may be practiced. These embodiments were described in sufficient detail to enable those skilled in the art to practice the embodiments, but other embodiments may be used, and logical, mechanical, electrical, and other changes may be made without departing from the scope of the various embodiments. In the previous description, numerous specific details were set forth to provide a thorough understanding the various embodiments. But, the various embodiments may be practiced without these specific details. In other instances, well-known circuits, structures, and techniques have not been shown in detail in order not to obscure embodiments.

As used herein, "a number of" when used with reference to items, means one or more items. For example, "a number of different types of networks" is one or more different types of networks.

When different reference numbers comprise a common number followed by differing letters (e.g., 100*a*, 100*b*, 100*c*) or punctuation followed by differing numbers (e.g., 100-1, 100-2, or 100.1, 100.2), use of the reference character only without the letter or following numbers (e.g., 100) may refer to the group of elements as a whole, any subset of the group, or an example specimen of the group.

Further, the phrase "at least one of," when used with a list of items, means different combinations of one or more of the listed items can be used, and only one of each item in the list may be needed. In other words, "at least one of" means any combination of items and number of items may be used from the list, but not all of the items in the list are required. The item can be a particular object, a thing, or a category.

For example, without limitation, "at least one of item A, item B, or item C" may include item A, item A and item B, or item B. This example also may include item A, item B, and item C or item B and item C. Of course, any combinations of these items can be present. In some illustrative examples, "at least one of" can be, for example, without limitation, two of item A; one of item B; and ten of item C; four of item B and seven of item C; or other suitable combinations.

Different instances of the word "embodiment" as used within this specification do not necessarily refer to the same embodiment, but they may. Any data and data structures illustrated or described herein are examples only, and in other embodiments, different amounts of data, types of data, fields, numbers and types of fields, field names, numbers and types of rows, records, entries, or organizations of data may be used. In addition, any data may be combined with logic, so that a separate data structure may not be necessary. The previous detailed description is, therefore, not to be taken in a limiting sense.

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Although the present invention has been described in terms of specific embodiments, it is anticipated that alterations and modification thereof will become apparent to the skilled in the art. Therefore, it is intended that the following claims be interpreted as covering all such alterations and modifications as fall within the true spirit and scope of the invention.

What is claimed is:

1. A semiconductor component, comprising:
   a backside contact;
   two inactive transistor gates each associated with a region of source/drain material of a respective transistor, the region of source/drain material of at least one of the transistors in direct contact with the backside contact; and
   a diffusion break formed between the two inactive transistor gates and made of a dielectric material, the diffusion break extending from a lowermost surface that is substantially coplanar with a lowermost surface of the backside contact to an uppermost surface that is substantially coplanar with an uppermost surface of the region of source/drain material of at least one of the inactive transistor gates.

2. The semiconductor component of claim 1, wherein:
each of the two inactive transistor gates includes a gate; and
the diffusion break is in direct contact with the gate of each inactive transistor gate.

3. The semiconductor component of claim 1, further comprising:
an inner layer dielectric material in direct contact with the region of source/drain material of at least one of the transistors, wherein the uppermost surface of the diffusion break is in direct contact with the inner layer dielectric material.

4. The semiconductor component of claim 3, wherein:
the dielectric material of the diffusion break is a different material than the inner layer dielectric material.

5. The semiconductor component of claim 1, wherein:
the backside contact has a first contact width where it is in direct contact with a backside interconnect;
the diffusion break has a second contact width where it is in direct contact with the backside interconnect; and
the first contact width is the same as the second contact width.

6. The semiconductor component of claim 1, wherein:
the diffusion break includes an upper portion and a lower portion;
the upper portion is delimited by the uppermost surface of the diffusion break and has an upper width;
the lower portion is delimited by the lowermost surface of the diffusion break and has a lower width that is different than the upper width.

7. The semiconductor component of claim 6, wherein:
the upper width is substantially equal to a width of the region of source/drain material of at least one of the transistor gates.

8. The semiconductor component of claim 6, wherein:
the lower width is substantially equal to a width of the backside contact.

9. The semiconductor component of claim 6, wherein:
the diffusion break is substantially symmetrical about a vertical axis; and
the diffusion break further includes an extension extending from the upper portion and extending farther from the vertical axis than the upper width.

10. The semiconductor component of claim 9, wherein:
the extension is in direct contact with a gate of at least one of the transistors.

11. A semiconductor component, comprising:
a plurality of transistor gates, each transistor gate including a region of source/drain material that is symmetrical about a vertical axis, the transistor gates arranged such that the vertical axes of each region of source/drain material of adjacent transistor gates are separated by a gate spacing, the gate spacing being larger than a minimum spacing between all adjacent transistor gates; and
a diffusion break made of a region of dielectric material that is symmetrical about a vertical diffusion break axis, the diffusion break arranged between two of the transistor gates such that a break spacing between the vertical diffusion break axis and the vertical axis of each of the two transistor gates is substantially equal to the gate spacing, the diffusion break having an uppermost surface that is substantially coplanar with an uppermost surface of the region of source/drain material of at least one of the two transistor gates, the diffusion break having a lowermost surface that is substantially coplanar with a lowermost surface of a backside contact that is in direct contact with the region of source/drain material of at least one of the transistor gates.

12. The semiconductor component of claim 11, wherein:
the diffusion break includes an extension that is in direct contact with a gate of at least one of the two transistor gates.

13. The semiconductor component of claim 11, further comprising:
a backside interconnect in direct contact with the lowermost surface of the diffusion break.

14. The semiconductor component of claim 11, wherein:
the diffusion break includes an upper portion and a lower portion;
the upper portion is delimited by the uppermost surface of the diffusion break and has an upper width; and
the lower portion is delimited by the lowermost surface of the diffusion break and has a lower width that is different than the upper width.

15. The semiconductor component of claim 14, wherein:
the upper width is substantially equal to a width of the region of source/drain material of at least one of the transistor gates.

16. The semiconductor component of claim 14, wherein:
the lower width is substantially equal to a width of the backside contact.

17. A method for making a semiconductor component, the method comprising:
forming an opening between two transistor gates such that the opening is delimited by an uppermost surface that is substantially coplanar with an uppermost surface of a region of source/drain material of one of the two transistor gates and such that the opening is open through a region of backside interlayer dielectric material;
filling the opening with dielectric material to form a diffusion break having a lowermost surface that is substantially coplanar with a lowermost surface of the region of backside interlayer dielectric material; and
forming a backside contact in direct contact with one of the two transistor gates and having a lowermost surface that is substantially coplanar with the lowermost surface of the diffusion break.

18. The method of claim 17, wherein:
forming the opening includes removing a placeholder and a region of source/drain material associated with the placeholder.

19. The method of claim 17, wherein:
forming the opening includes removing at least a portion of silicon sheets from at least one of the two transistor gates.

20. A method of forming a semiconductor component, the method comprising:
removing one of a plurality of regions of source/drain material to form an opening delimited by an uppermost surface that is substantially coplanar with an uppermost surface of a remaining region of source/drain material;
filling the opening with dielectric material to form a diffusion break having a lowermost surface that is substantially coplanar with a lowermost surface of a region of backside interlayer dielectric material; and
forming a backside interconnect in direct contact with the lowermost surface of the diffusion break.

21. The method of claim 20, further comprising:
forming a backside contact in direct contact with the remaining region of source/drain material such that a lowermost surface of the backside contact is substantially coplanar with the lowermost surface of the diffusion break.

22. The method of claim 20, further comprising:

removing silicon from between the regions of source/drain material prior to removing the one of the plurality of regions of source/drain material.

23. A method of forming a semiconductor component, the method comprising:

forming a frontside contact in direct contact with a first region of source/drain material of a plurality of regions of source/drain material;

removing a second region of source/drain material of the plurality of regions of source/drain material to form an opening delimited by an uppermost surface that is substantially coplanar with an uppermost surface of the first region of source/drain material; and filling the opening with dielectric material to form a diffusion break having a lowermost surface that is substantially coplanar with a lowermost surface of a backside contact that is in direct contact with a third region of source/drain material of the plurality of regions of source/drain material.

24. The method of claim 23, further comprising:

forming a backside interconnect in direct contact with the lowermost surface of the diffusion break.

25. The method of claim 23, further comprising:

removing at least a portion of silicon sheets in direct contact with the second region of source/drain material.

* * * * *